(12) United States Patent
Wang et al.

(10) Patent No.: US 9,716,488 B2
(45) Date of Patent: Jul. 25, 2017

(54) CARBON NANOTUBE FIELD EFFECT TRANSISTOR-BASED PULSE GENERATOR

(71) Applicant: Ningbo University, Ningbo (CN)

(72) Inventors: Pengjun Wang, Ningbo (CN); Qian Wang, Ningbo (CN); Daohui Gong, Ningbo (CN)

(73) Assignee: NINGBO UNIVERSITY, Ningbo (CN)

( * ) Notice: Subject to any disclaimer, the term of this patent is extended or adjusted under 35 U.S.C. 154(b) by 0 days.

(21) Appl. No.: 15/334,313

(22) Filed: Oct. 26, 2016

(65) Prior Publication Data

US 2017/0117881 A1    Apr. 27, 2017

(30) Foreign Application Priority Data

Oct. 26, 2015 (CN) .......................... 2015 1 0701869

(51) Int. Cl.
| | | |
|---|---|---|
| *H01L 29/06* | (2006.01) | |
| *H03K 3/84* | (2006.01) | |
| *H03K 3/012* | (2006.01) | |
| *H01L 51/00* | (2006.01) | |
| *H01L 51/05* | (2006.01) | |
| *H01L 27/28* | (2006.01) | |
| *H03K 3/037* | (2006.01) | |

(52) U.S. Cl.
CPC .......... *H03K 3/012* (2013.01); *H01L 27/283* (2013.01); *H01L 51/0048* (2013.01); *H01L 51/0566* (2013.01); *H03K 3/037* (2013.01)

(58) Field of Classification Search
CPC .. H03K 3/00; H03K 3/78; H03K 3/64; H03K 3/84; H03K 3/012; H03K 3/037; G06F 1/02; G06F 1/022; H01L 27/283; H01L 51/0048; H01L 51/0558; H01L 51/0568; B82Y 10/00
USPC ........................... 257/29; 327/164, 291, 295
See application file for complete search history.

(56) References Cited

U.S. PATENT DOCUMENTS

| | | | | |
|---|---|---|---|---|
| 6,377,099 B1* | 4/2002 | Cairns | ................. | G09G 3/3688 327/217 |
| 8,107,587 B2* | 1/2012 | Zebedee | ................. | G09G 3/20 327/217 |
| 8,723,578 B1* | 5/2014 | Schwartz | ............... | H03K 3/012 327/172 |
| 2004/0162796 A1* | 8/2004 | Nugent | ................. | B82Y 10/00 706/27 |
| 2006/0132110 A1* | 6/2006 | Tang | ..................... | H02M 3/157 323/282 |
| 2009/0146720 A1* | 6/2009 | Lasbouygues | ......... | H03K 5/135 327/295 |

(Continued)

*Primary Examiner* — Kevin M Picardat
(74) *Attorney, Agent, or Firm* — Matthias Scholl, PC; Matthias Scholl

(57) ABSTRACT

A CNFET based pulse generator, including a first Carbon Nanotube Field Effect Transistor (CNFET), a second CNFET, a third CNFET, a fourth CNFET, a fifth CNFET, a sixth CNFET, a seventh CNFET, an eighth CNFET, a ninth CNFET, a tenth CNFET, an eleventh CNFET, a twelfth CNFET, a thirteenth CNFET, and a fourteenth CNFET. The first CNFET, the third CNFET, the fifth CNFET, the seventh CNFET, the tenth CNFET, the twelfth CNFET, and the thirteenth CNFET are P-type CNFETs. The second CNFET, the fourth CNFET, the sixth CNFET, the eighth CNFET, the ninth CNFET, the eleventh CNFET, and the fourteenth CNFET are N-type CNFETs.

4 Claims, 4 Drawing Sheets

(56) References Cited

U.S. PATENT DOCUMENTS

2014/0253201 A1* 9/2014 Jung ................ H03K 3/356104
327/291
2015/0180355 A1* 6/2015 Freeman ................ H02M 1/08
363/21.04

* cited by examiner

US 9,716,488 B2

CARBON NANOTUBE FIELD EFFECT TRANSISTOR-BASED PULSE GENERATOR

CROSS-REFERENCE TO RELATED APPLICATIONS

Pursuant to 35 U.S.C. §119 and the Paris Convention Treaty, this application claims the foreign priority benefit of Chinese Patent Application No. 201510701869.3 filed Oct. 26, 2015, the contents of which, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, and Cambridge, Mass. 02142.

BACKGROUND OF THE INVENTION

Field of the Invention

The invention relates to a pulse generator, and more particularly to a Carbon Nanotube Field Effect Transistor-based (CNFET-based) double-edge-triggered pulse generator.

Description of the Related Art

FIGS. 1-2 illustrate circuit diagrams of typical double-edge-triggered pulse generators. The double-edge-triggered pulse generators have a long time delay, and slow response speed. They also consume relatively high amounts of energy.

SUMMARY OF THE INVENTION

In view of the above-described problems, it is one objective of the invention to provide a CNFET-based double-edge-triggered pulse generator that has a short time delay and consumes relatively little energy.

To achieve the above objective, in accordance with one embodiment of the invention, there is provided a CNFET based pulse generator, comprising a first CNFET, a second CNFET, a third CNFET, a fourth CNFET, a fifth CNFET, a sixth CNFET, a seventh CNFET, an eighth CNFET, a ninth CNFET, a tenth CNFET, an eleventh CNFET, a twelfth CNFET, a thirteenth CNFET, and a fourteenth CNFET. The first CNFET, the third CNFET, the fifth CNFET, the seventh CNFET, the tenth CNFET, the twelfth CNFET, and the thirteenth CNFET are P-type CNFET. The second CNFET, the fourth CNFET, the sixth CNFET, the eighth CNFET, the ninth CNFET, the eleventh CNFET, and the fourteenth CNFET are N-type CNFET.

In a class of this embodiment, a gate of the first CNFET, a gate of the second CNFET, a source of the seventh CNFET, a gate of the eighth CNFET, and a gate of the thirteenth CNFET are connected together, and a connection end thereof is a signal input end of the pulse generator. A source of the first CNFET, a substrate of the first CNFET, a source of the third CNFET, a substrate of the third CNFET, a source of the fifth CNFET, a substrate of the fifth CNFET, a substrate of the seventh CNFET, a source of the tenth CNFET, a substrate of the tenth CNFET, a source of the twelfth CNFET, a substrate of the twelfth CNFET, and a substrate of the thirteenth CNFET are connected to a power supply. A drain of the first CNFET, a drain of the second CNFET, a gate of third CNFET, and a gate of the fourth CNFET are connected together. A drain of the third CNFET, a drain of the fourth CNFET, a gate of the fifth CNFET, and a gate of the sixth CNFET are connected together. A drain of the fifth CNFET, a drain of the sixth CNFET, a gate of the seventh CNFET, a gate of the ninth CNFET, a gate of the twelfth CNFET, and a gate of the fourteenth CNFET are connected together. A drain of the seventh CNFET, a drain of the eighth CNFET, a gate of the tenth CNFET, and a gate of the eleventh CNFET are connected together. A source of the eighth CNFET, a drain of the ninth CNFET, a drain of the twelfth CNFET, and a drain of the thirteenth CNFET are connected together. A drain of the tenth CNFET, a drain of the eleventh CNFET, a source of the thirteenth CNFET, and a drain of the fourteenth are connected together, and a connection end thereof is a signal output end of the pulse generator. A substrate of the second CNFET, a source of the second CNFET, a substrate of the fourth CNFET, a source of the fourth CNFET, a substrate of the sixth CNFET, a source of the sixth CNFET, a substrate of the eighth CNFET, a substrate of the ninth CNFET, a source of the ninth CNFET, a substrate of the eleventh CNFET, a source of the eleventh CNFET, a substrate of the fourteenth CNFET, and a source of the fourteenth CNFET are grounded.

In a class of this embodiment, the first CNFET, the second CNFET, the third CNFET, the fourth CNFET, the fifth CNFET, the sixth CNFET, the tenth CNFET, and the eleventh CNFET are CNFETs having a diameter of 0.398 nm. The seventh CNFET, the eighth CNFET, the ninth CNFET, the twelfth CNFET, the thirteenth CNFET, and the fourteenth CNFET are CNFETs having a diameter of 0.293 nm. In the structure of the pulse generator, the CNFET having the larger diameter with high threshold operates to provide more time delay of reverse signal, so as to increase the pulse width and the pulse amplitude and improve the drive capacity. The CNFET having the smaller diameter with low threshold operates to improve the speed of the circuit.

In a class of this embodiment, the pulse generator further comprises a signal conditioning circuit. The signal conditioning circuit comprises a fifteenth CNFET, a sixteenth CNFET, a seventeenth CNFET, and an eighteenth CNFET. The fifteenth CNFET and the seventeenth CNFET are P-type CNFET. The sixteenth CNFET and the eighteenth CNFET are N-type CNFET. A gate of the fifteenth CNFET and a gate of the sixteenth CNFET are connected to the signal output end of the pulse generator. A drain of the fifteenth CNFET, a drain of the sixteenth CNFET, a gate of the seventeenth CNFET, and a gate of the eighteenth CNFET are connected together. A source of the fifteenth CNFET, a substrate of the fifteenth CNFET, a source of the seventeenth CNFET, and a substrate of the seventeenth CNFET are connected to the power supply. A source of the sixteenth CNFET, a substrate of the sixteenth CNFET, a source of the eighteenth CNFET, and a substrate of eighteenth CNFET are grounded. A drain of the seventeenth CNFET is connected to a drain of the eighteenth CNFET, and a connection end thereof is an output end of the signal conditioning circuit. The signal conditioning circuit operates to regulate the waveform of the pulse signal output from the signal output end of the pulse generator, thus improving the accuracy of the pulse signal.

In a class of this embodiment, the first CNFET, the second CNFET, the third CNFET, the fourth CNFET, the fifth CNFET, the sixth CNFET, the tenth CNFET, and the eleventh CNFET are CNFETs having a diameter of 0.398 nm. The seventh CNFET, the eighth CNFET, the ninth CNFET, the twelfth CNFET, the thirteenth CNFET, the fourteenth CNFET, the fifteenth CNFET, the sixteenth CNFET, the seventeenth CNFET, and the eighteenth CNFET are CNFETs having a diameter of 0.293 nm. In the structure of the pulse generator, the CNFET having the larger diameter with high threshold operates to provide more time delay of reverse signal, so as to increase the pulse width and the pulse amplitude and improve the drive capacity. The CNFET having the smaller diameter with low threshold operates to improve the speed of the circuit.

Advantages of the pulse generator according to embodiments of the invention are summarized as follows:

When signal input end of the pulse generator is connected to the input signal, the signal generated at the first node which is connecting the drain of the fifth CNFET, the drain of the sixth CNFET, the gate of the seventh CNFET, the gate of the ninth CNFET, the gate of the twelfth CNFET, and the gate of the fourteenth CNFET is the inverted signal of the input signal. If the input signal is at the low level (which is 0), the inverted signal of the input signal is at the high level (which is 1), and the ninth CNFET, the thirteenth CNFET, and the fourteenth CNFET are in the on-state, meanwhile the seventh CNFET, the eighth CNFET, and the twelfth CNFET are cut off, and the second node connecting the source of the eighth CNFET and the drain of the ninth CNFET and the third node connecting the source of the thirteenth CNFET and the drain of the fourteenth CNFET are at the low level, thus the signal output end of the pulse generator outputs the low level. When the input signal is at the rising edge, due to a time delay effect of the first CNFET, the second CNFET, the third CNFET, the fourth CNFET, the fifth CNFET, and the sixth CNFET, the signal variation at the fourth node connecting the drain of the fifth CNFET, the drain of the sixth CNFET, the gate of the seventh CNFET, the gate of the ninth CNFET, the gate of the twelfth CNFET, and the gate of the fourteenth CNFET undergoes three gate delay. At the same time, the seventh CNFET and the twelfth CNFET undergo three gate delay and change from off-state to on-state, and the ninth CNFET and the fourteenth CNFET undergo three gate delay and change from on-state to off-state. The eighth CNFET is in the on-state, and the thirteenth CNFET is cut off. The fifth node connecting the drain of the seventh CNFET, the drain of the eighth CNFET, the gate of the tenth CNFET, and the gate of the eleventh CNFET is at the low level first then changed to be at the high level. Therefore, the signal output end of the pulse generator is at the low level then changed to be at the high level, and finally changed from the high level to the low level, thus forming a narrow signal.

If the input signal is at the high level, the seventh CNFET, the eighth CNFET, and the twelfth CNFET are in the on-state, and the ninth CNFET, the thirteenth CNFET, and the fourteenth CNFET are cut off, meanwhile The fifth node connecting the drain of the seventh CNFET, the drain of the eighth CNFET, the gate of the tenth CNFET, and the gate of the eleventh CNFET, and the fifth node connecting the drain of the twelfth CNFET and the drain of the thirteenth CNFET are both at the high level, while the signal output end of the pulse generator is maintained at the low level. When the input signal is at the falling edge, due to the time delay effect of the first CNFET, the second CNFET, the third CNFET, the fourth CNFET, the fifth CNFET, and the sixth CNFET, the signal variation at the fourth node connecting the drain of the fifth CNFET, the drain of the sixth CNFET, the gate of the seventh CNFET, the gate of the ninth CNFET, the gate of the twelfth CNFET, and the gate of the fourteenth CNFET undergoes three gate delay. At the same time, the seventh CNFET and the twelfth CNFET undergo three gate delay and change from on-state to off-state, and the ninth CNFET and the fourteenth CNFET undergo three gate delay and change from off-state to on-state. The eighth CNFET is cut off, and the thirteenth CNFET is in the on-state. The sixth node connecting the drain of the twelfth CNFET and the source of the thirteenth CNFET is at the high level, discharging, and in the on-state, following the short delay, because the twelfth CNFET is cut off and the fourteenth CNFET is in the on-state, the fifth node is changed to be at the low level. Therefore, the signal output end of the pulse generator is at the low level then changed to be at the high level, and finally changed from the high level to the low level, thus forming a narrow signal. The pulse generator in the invention can immediately produce pulse at two edges of the input signal, thus the pulse triggered flip-flop can achieve minimum input-output time delay. The charge path and the discharge path of the signal output end of the pulse generator are not simultaneously turned on, thus during operation no short-circuit path exists, eliminating short circuit power consumption. In addition, the CNFET features high speed and low power consumption, compared with existing double-edge-triggered pulse generator, the CNFET-based double-edge-triggered pulse generator in the invention features short time delay and low power consumption.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a CNFET-based double-edge-triggered pulse generator are described below. It should be noted that the following examples are intended to describe and not to limit the invention.

Example 1

Figure 1:
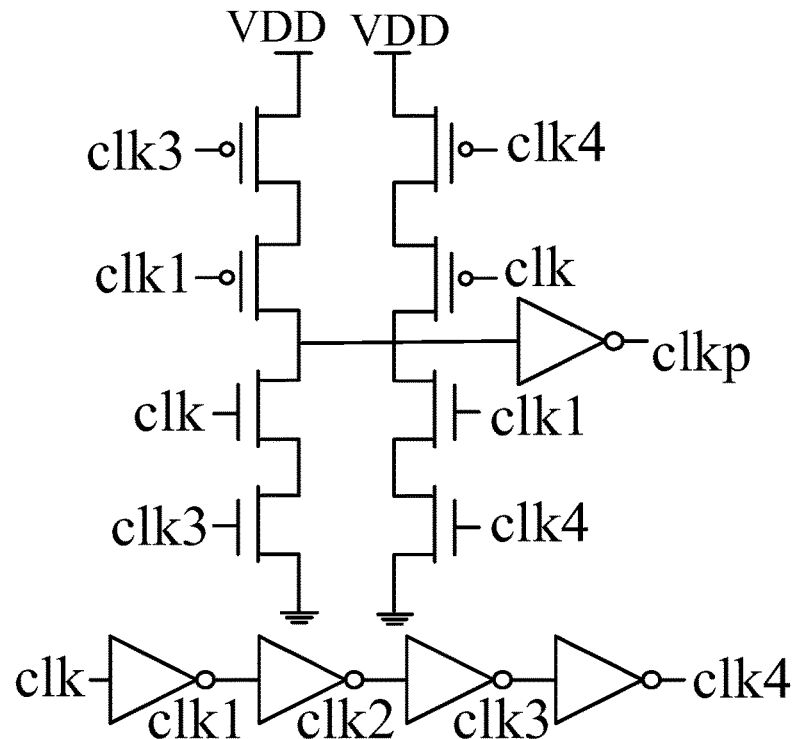
FIG. 1 is a circuit diagram of a first double-edge-triggered pulse generator in the prior art.
Figure 2:
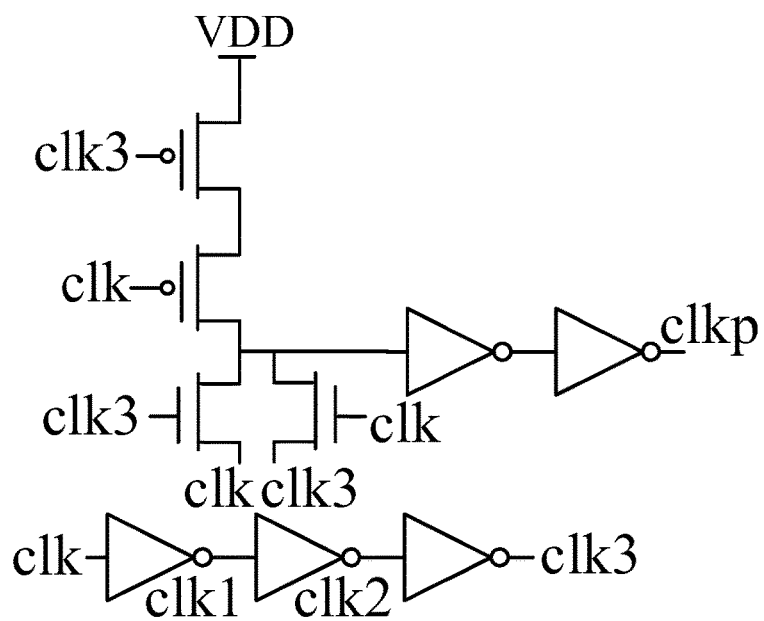
FIG. 2 is a circuit diagram of a second double-edge-triggered pulse generator in the prior art.
Figure 3:
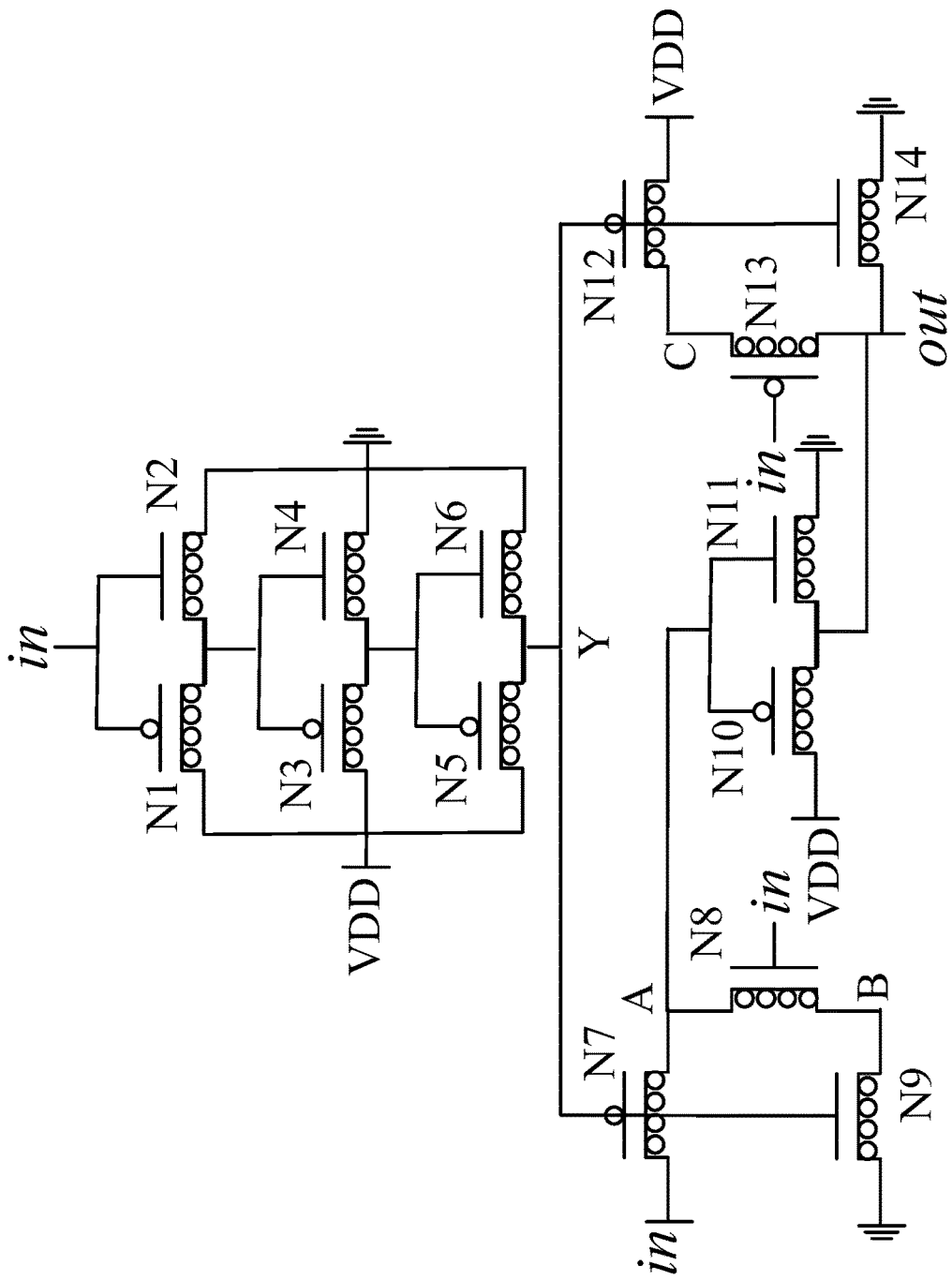
FIG. 3 is a circuit diagram of a CNFET-based double-edge-triggered pulse generator in Example 1.

As shown in FIG. 3, a CNFET based pulse generator, comprising a first Carbon Nanotube Field Effect Transistor (CNFET) N1, a second CNFET N2, a third CNFET N3, a fourth CNFET N4, a fifth CNFET N5, a sixth CNFET N6, a seventh CNFET N7, an eighth CNFET N8, a ninth CNFET N9, a tenth CNFET N10, an eleventh CNFET N11, a twelfth CNFET N12, a thirteenth CNFET N13, and a fourteenth CNFET N14. The first CNFET N1, the third CNFET N3, the fifth CNFET N5, the seventh CNFET N7, the tenth CNFET N10, the twelfth CNFET N12, and the thirteenth CNFET N13 are P-type CNFET. The second CNFET N2, the fourth CNFET N4, the sixth CNFET N6, the eighth CNFET N8, the ninth CNFET N9, the eleventh CNFET N11, and the fourteenth CNFET N14 are N-type CNFET.

A gate of the first CNFET N1, a gate of the second CNFET N2, a source of the seventh CNFET N7, a gate of the eighth CNFET N8, and a gate of the thirteenth CNFET N13 are connected together, and a connection end thereof is a signal input end of the pulse generator. A source of the first CNFET N1, a substrate of the first CNFET N1, a source of the third CNFET N3, a substrate of the third CNFET N3, a source of the fifth CNFET N5, a substrate of the fifth CNFET N5, a substrate of the seventh CNFET N7, a source of the tenth CNFET N10, a substrate of the tenth CNFET N10, a source of the twelfth CNFET N12, a substrate of the twelfth CNFET N12, and a substrate of the thirteenth CNFET N13 are connected to a power supply. A drain of the first CNFET N1, a drain of the second CNFET N2, a gate of third CNFET N3, and a gate of the fourth CNFET N4 are connected together. A drain of the third CNFET N3, a drain of the fourth CNFET N4, a gate of the fifth CNFET N5, and a gate of the sixth CNFET N6 are connected together. A drain of the fifth CNFET N5, a drain of the sixth CNFET N6, a gate of the seventh CNFET N7, a gate of the ninth CNFET N9, a gate of the twelfth CNFET N12, and a gate of the fourteenth CNFET N14 are connected together. A drain of the seventh CNFET N7, a drain of the eighth CNFET N8, a gate of the tenth CNFET N10, and a gate of the eleventh CNFET N11 are connected together. A source of the eighth CNFET N8 and a drain of the ninth CNFET N9 are connected. A drain of the twelfth CNFET N12 and a drain of the thirteenth CNFET N13 are connected together. A drain of the tenth CNFET N10, a drain of the eleventh CNFET N11, a source of the thirteenth CNFET N13, and a drain of the fourteenth N14 are connected together, and a connection end thereof is a signal output end of the pulse generator. A substrate of the second CNFET N2, a source of the second CNFET N2, a substrate of the fourth CNFET N4, a source of the fourth CNFET N4, a substrate of the sixth CNFET N6, a source of the sixth CNFET N6, a substrate of the eighth CNFET N8, a substrate of the ninth CNFET N9, a source of the ninth CNFET N9, a substrate of the eleventh CNFET N11, a source of the eleventh CNFET N11, a substrate of the fourteenth CNFET N14, and a source of the fourteenth CNFET N14 are grounded.

The working process of the CNFET-based double-edge-triggered pulse generator is as follows:

When signal input end of the pulse generator is connected to the input signal in, the signal generated at the first node A which is connecting the drain of the fifth CNFET N5, the drain of the sixth CNFET N6, the gate of the seventh CNFET N7, the gate of the ninth CNFET N9, the gate of the twelfth CNFET N12, and the gate of the fourteenth CNFET N14 is the inverted signal of the input signal. The first CNFET and the second CNFET form a first inverted gate circuit. The third CNFET and the fourth CNFET form a second inverted gate circuit. The fifth CNFET and the sixth CNFET form a third inverted gate circuit.

If the input signal in is at the low level (which is 0), the inverted signal of the input signal is at the high level (which is 1), and the ninth CNFET N9, the thirteenth CNFET N13, and the fourteenth CNFET N14 are in the on-state, meanwhile the seventh CNFET N7, the eighth CNFET N8, and the twelfth CNFET N12 are cut off, and the second node B connecting the source of the eighth CNFET N8 and the drain of the ninth CNFET N9 and the third node connecting the source of the thirteenth CNFET N13 and the drain of the fourteenth CNFET N14 are at the low level, thus the signal output end out of the pulse generator outputs the low level.

When the input signal in is at the rising edge, due to a time delay effect of the first CNFET N1, the second CNFET N2, the third CNFET N3, the fourth CNFET N4, the fifth CNFET N5, and the sixth CNFET N6, the signal variation at the fourth node Y connecting the drain of the fifth CNFET N5, the drain of the sixth CNFET N6, the gate of the seventh CNFET N7, the gate of the ninth CNFET N9, the gate of the twelfth CNFET N12, and the gate of the fourteenth CNFET N14 undergoes three gate delay. At the same time, the seventh CNFET N7 and the twelfth CNFET N12 undergo three gate delay and change from off-state to on-state, and the ninth CNFET N9 and the fourteenth CNFET N14 undergo three gate delay and change from on-state to off-state. The eighth CNFET N8 is in the on-state, and the thirteenth CNFET N13 is cut off. The first node A connecting the drain of the seventh CNFET N7, the drain of the eighth CNFET N8, the gate of the tenth CNFET N10, and the gate of the eleventh CNFET N11 is at the low level first then changed to be at the high level. Therefore, the signal output end out of the pulse generator is at the low level then changed to be at the high level, and finally changed from the high level to the low level, thus forming a narrow signal.

If the input signal in is at the high level, the seventh CNFET N7, the eighth CNFET N8, and the twelfth CNFET N12 are in the on-state, and the ninth CNFET N9, the thirteenth CNFET N13, and the fourteenth CNFET N14 are cut off, meanwhile the first node A connecting the drain of the seventh CNFET N7, the drain of the eighth CNFET N8, the gate of the tenth CNFET N10, and the gate of the eleventh CNFET N11, and the fifth node C connecting the drain of the twelfth CNFET N12 and the drain of the thirteenth CNFET N13 are both at the high level, while the signal output end out of the pulse generator is maintained at the low level.

When the input signal in is at the falling edge, due to the time delay effect of the first CNFET N1, the second CNFET N2, the third CNFET N3, the fourth CNFET N4, the fifth CNFET N5, and the sixth CNFET N6, the signal variation at the fourth node Y connecting the drain of the fifth CNFET N5, the drain of the sixth CNFET N6, the gate of the seventh CNFET N7, the gate of the ninth CNFET N9, the gate of the twelfth CNFET N12, and the gate of the fourteenth CNFET N14 undergoes three gate delay. At the same time, the seventh CNFET N7 and the twelfth CNFET N12 undergo three gate delay and change from on-state to off-state, and the ninth CNFET N9 and the fourteenth CNFET N14 undergo three gate delay and change from off-state to on-state. The eighth CNFET N8 is cut off, and the thirteenth CNFET N13 is in the on-state. The fifth node C connecting the drain of the twelfth CNFET N12 and the source of the thirteenth CNFET N13 is at the high level, discharging, and in the on-state, Following the short delay, because the twelfth CNFET N12 is cut off and the fourteenth CNFET N14 is in the on-state, the fifth node is changed to be at the low level. Therefore, the signal output end out of the pulse generator is at the low level then changed to be at the high level, and finally changed from the high level to the low level, thus forming a narrow signal.

The pulse generator in the invention can immediately produce pulse at two edges of the input signal in, thus the pulse triggered flip-flop can achieve minimum input-output time delay. The charge path and the discharge path of the signal output end of the pulse generator are not simultaneously turned on, thus during operation no short-circuit path exists, eliminating short circuit power consumption. In addition, the CNFET features high speed and low power consumption, compared with existing double-edge-triggered pulse generator, the CNFET-based double-edge-triggered pulse generator in the invention features short time delay and low power consumption.

Example 2

As shown in FIG. 3, a CNFET based pulse generator, comprising a first Carbon Nanotube Field Effect Transistor (CNFET) N1, a second CNFET N2, a third CNFET N3, a fourth CNFET N4, a fifth CNFET N5, a sixth CNFET N6, a seventh CNFET N7, an eighth CNFET N8, a ninth CNFET N9, a tenth CNFET N10, an eleventh CNFET N11, a twelfth CNFET N12, a thirteenth CNFET N13, and a fourteenth CNFET N14. The first CNFET N1, the third CNFET N3, the fifth CNFET N5, the seventh CNFET N7, the tenth CNFET N10, the twelfth CNFET N12, and the thirteenth CNFET N13 are P-type CNFET. The second CNFET N2, the fourth CNFET N4, the sixth CNFET N6, the eighth CNFET N8, the ninth CNFET N9, the eleventh CNFET N11, and the fourteenth CNFET N14 are N-type CNFET.

A gate of the first CNFET N1, a gate of the second CNFET N2, a source of the seventh CNFET N7, a gate of the eighth CNFET N8, and a gate of the thirteenth CNFET N13 are connected together, and a connection end thereof is a signal input end of the pulse generator. A source of the first CNFET N1, a substrate of the first CNFET N1, a source of the third CNFET N3, a substrate of the third CNFET N3, a source of the fifth CNFET N5, a substrate of the fifth CNFET N5, a substrate of the seventh CNFET N7, a source of the tenth CNFET N10, a substrate of the tenth CNFET N10, a source of the twelfth CNFET N12, a substrate of the twelfth CNFET N12, and a substrate of the thirteenth CNFET N13 are connected to a power supply. A drain of the first CNFET N1, a drain of the second CNFET N2, a gate of third CNFET N3, and a gate of the fourth CNFET N4 are connected together. A drain of the third CNFET N3, a drain of the fourth CNFET N4, a gate of the fifth CNFET N5, and a gate of the sixth CNFET N6 are connected together. A drain of the fifth CNFET N5, a drain of the sixth CNFET N6, a gate of the seventh CNFET N7, a gate of the ninth CNFET N9, a gate of the twelfth CNFET N12, and a gate of the fourteenth CNFET N14 are connected together. A drain of the seventh CNFET N7, a drain of the eighth CNFET N8, a gate of the tenth CNFET N10, and a gate of the eleventh CNFET N11 are connected together. A source of the eighth CNFET N8 and a drain of the ninth CNFET N9 are connected. A drain of the twelfth CNFET N12 and a drain of the thirteenth CNFET N13 are connected together. A drain of the tenth CNFET N10, a drain of the eleventh CNFET N11, a source of the thirteenth CNFET N13, and a drain of the fourteenth N14 are connected together, and a connection end thereof is a signal output end of the pulse generator. A substrate of the second CNFET N2, a source of the second CNFET N2, a substrate of the fourth CNFET N4, a source of the fourth CNFET N4, a substrate of the sixth CNFET N6, a source of the sixth CNFET N6, a substrate of the eighth CNFET N8, a substrate of the ninth CNFET N9, a source of the ninth CNFET N9, a substrate of the eleventh CNFET N11, a source of the eleventh CNFET N11, a substrate of the fourteenth CNFET N14, and a source of the fourteenth CNFET N14 are grounded.

In the example, the first CNFET N1, the second CNFET N2, the third CNFET N3, the fourth CNFET N4, the fifth CNFET N5, the sixth CNFET N6, the tenth CNFET N10, and the eleventh CNFET N11 are CNFETs having a diameter of 0.398 nm. The seventh CNFET N7, the eighth CNFET N8, the ninth CNFET N9, the twelfth CNFET N12, the thirteenth CNFET N13, and the fourteenth CNFET N14 are CNFETs having a diameter of 0.293 nm.

Example 3

Figure 4:
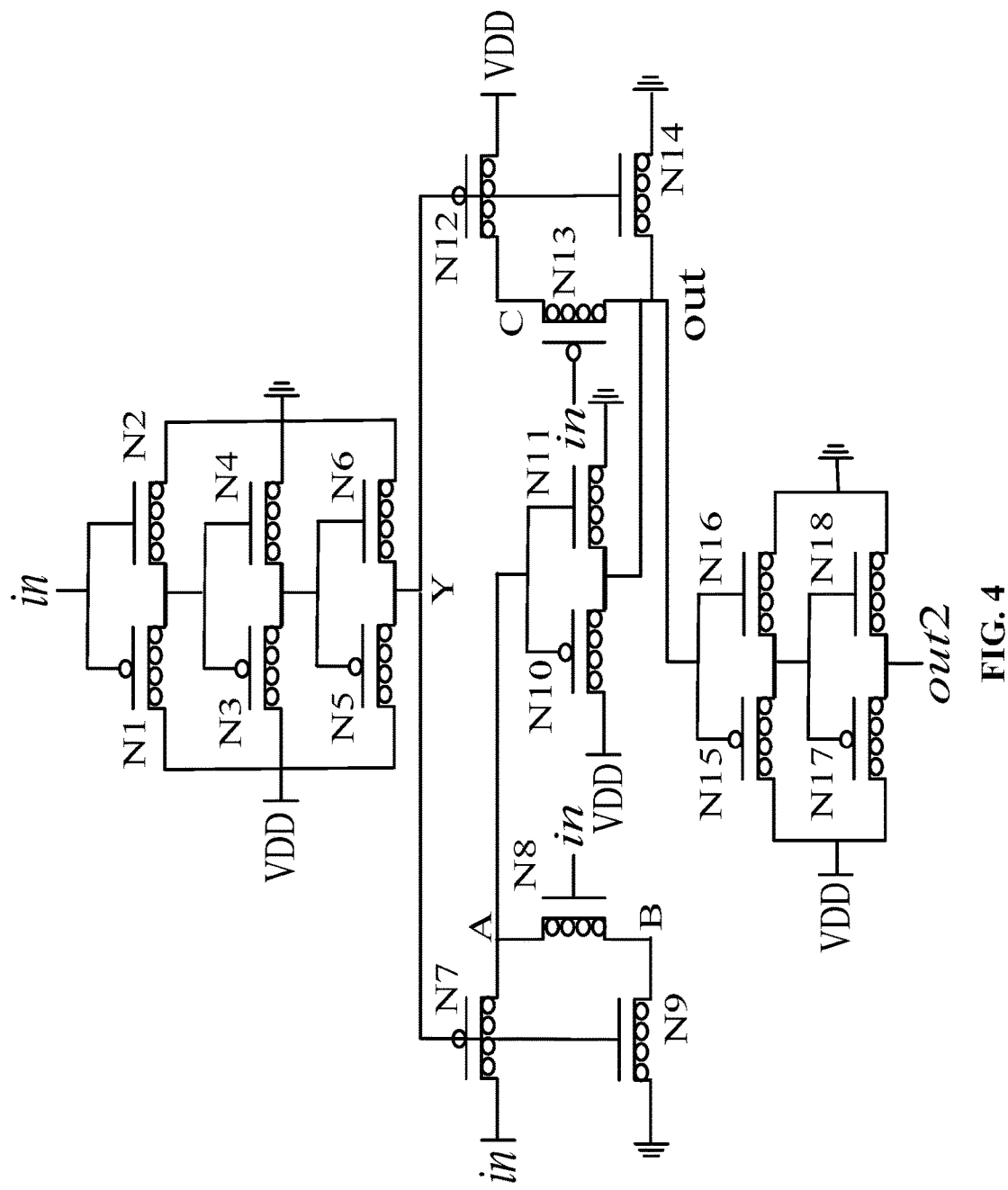
FIG. 4 is a circuit diagram of a CNFET-based double-edge-triggered pulse generator in Example 2.

As shown in FIG. 4, a CNFET based pulse generator, comprising a first Carbon Nanotube Field Effect Transistor (CNFET) N1, a second CNFET N2, a third CNFET N3, a fourth CNFET N4, a fifth CNFET N5, a sixth CNFET N6, a seventh CNFET N7, an eighth CNFET N8, a ninth CNFET N9, a tenth CNFET N10, an eleventh CNFET N11, a twelfth CNFET N12, a thirteenth CNFET N13, and a fourteenth CNFET N14. The first CNFET N1, the third CNFET N3, the fifth CNFET N5, the seventh CNFET N7, the tenth CNFET N10, the twelfth CNFET N12, and the thirteenth CNFET N13 are P-type CNFET. The second CNFET N2, the fourth CNFET N4, the sixth CNFET N6, the eighth CNFET N8, the ninth CNFET N9, the eleventh CNFET N11, and the fourteenth CNFET N14 are N-type CNFET.

A gate of the first CNFET N1, a gate of the second CNFET N2, a source of the seventh CNFET N7, a gate of the eighth CNFET N8, and a gate of the thirteenth CNFET N13 are connected together, and a connection end thereof is a signal input end of the pulse generator. A source of the first CNFET N1, a substrate of the first CNFET N1, a source of the third CNFET N3, a substrate of the third CNFET N3, a source of the fifth CNFET N5, a substrate of the fifth CNFET N5, a substrate of the seventh CNFET N7, a source of the tenth CNFET N10, a substrate of the tenth CNFET N10, a source of the twelfth CNFET N12, a substrate of the twelfth CNFET N12, and a substrate of the thirteenth CNFET N13 are connected to a power supply. A drain of the first CNFET N1, a drain of the second CNFET N2, a gate of third CNFET N3, and a gate of the fourth CNFET N4 are connected together. A drain of the third CNFET N3, a drain of the fourth CNFET N4, a gate of the fifth CNFET N5, and a gate of the sixth CNFET N6 are connected together. A drain of the fifth CNFET N5, a drain of the sixth CNFET N6, a gate of the seventh CNFET N7, a gate of the ninth CNFET N9, a gate of the twelfth CNFET N12, and a gate of the fourteenth CNFET N14 are connected together. A drain of the seventh CNFET N7, a drain of the eighth CNFET N8, a gate of the tenth CNFET N10, and a gate of the eleventh CNFET N11 are connected together. A source of the eighth CNFET N8 and a drain of the ninth CNFET N9 are connected. A drain of the twelfth CNFET N12 and a drain of the thirteenth CNFET N13 are connected together. A drain of the tenth CNFET N10, a drain of the eleventh CNFET N11, a source of the thirteenth CNFET N13, and a drain of the fourteenth N14 are connected together, and a connection end thereof is a signal output end of the pulse generator. A substrate of the second CNFET N2, a source of the second CNFET N2, a substrate of the fourth CNFET N4, a source of the fourth CNFET N4, a substrate of the sixth CNFET N6, a source of the sixth CNFET N6, a substrate of the eighth CNFET N8, a substrate of the ninth CNFET N9, a source of the ninth CNFET N9, a substrate of the eleventh CNFET N11, a source of the eleventh CNFET N11, a substrate of the fourteenth CNFET N14, and a source of the fourteenth CNFET N14 are grounded.

In the example, the pulse generator further comprises a signal conditioning circuit. The signal conditioning circuit comprises a fifteenth CNFET N15, a sixteenth CNFET N16, a seventeenth CNFET N17, and an eighteenth CNFET N18. The fifteenth CNFET N15 and the seventeenth CNFET N17 are P-type CNFET. The sixteenth CNFET N16 and the eighteenth CNFET N18 are N-type CNFET. A gate of the fifteenth CNFET N15 and a gate of the sixteenth CNFET N16 are connected to the signal output end of the pulse generator. A drain of the fifteenth CNFET N15, a drain of the sixteenth CNFET N16, a gate of the seventeenth CNFET N17, and a gate of the eighteenth CNFET N18 are connected together. A source of the fifteenth CNFET N15, a substrate of the fifteenth CNFET N15, a source of the seventeenth CNFET N17, and a substrate of the seventeenth CNFET N17 are connected to the power supply. A source of the sixteenth CNFET N16, a substrate of the sixteenth CNFET N16, a source of the eighteenth CNFET N18, and a substrate of eighteenth CNFET N18 are grounded. A drain of the seventeenth CNFET N17 is connected to a drain of the eighteenth CNFET N18, and a connection end thereof is an output end of the signal conditioning circuit.

Figure 5:
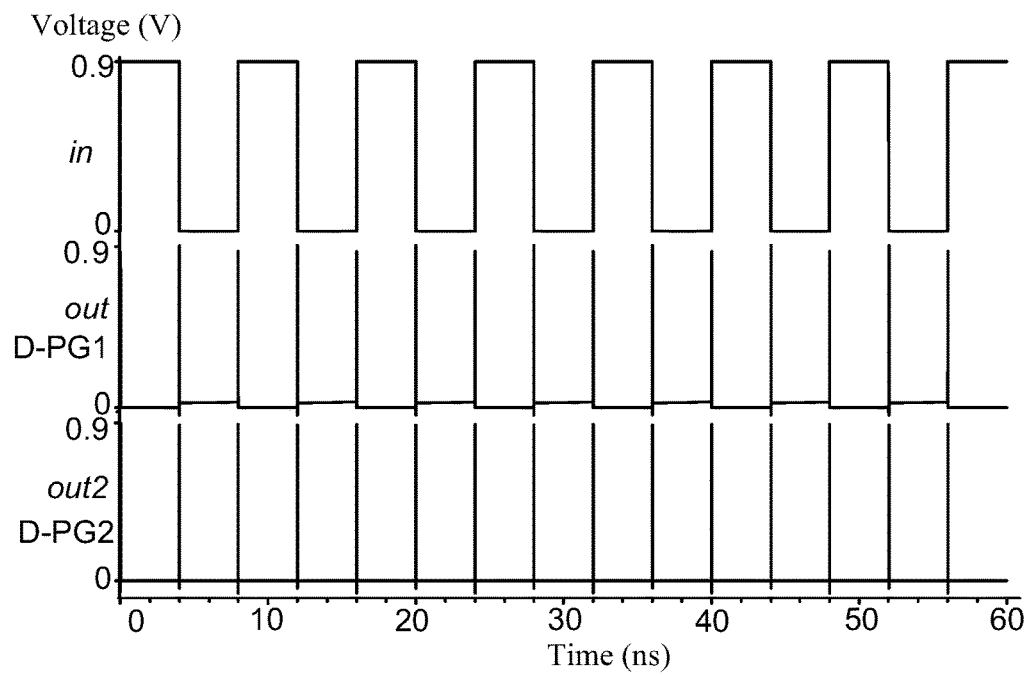
FIG. 5 is a waveform diagram of a CNFET-based double-edge-triggered pulse generator in an output transient in Examples 1-2.
Figure 6:
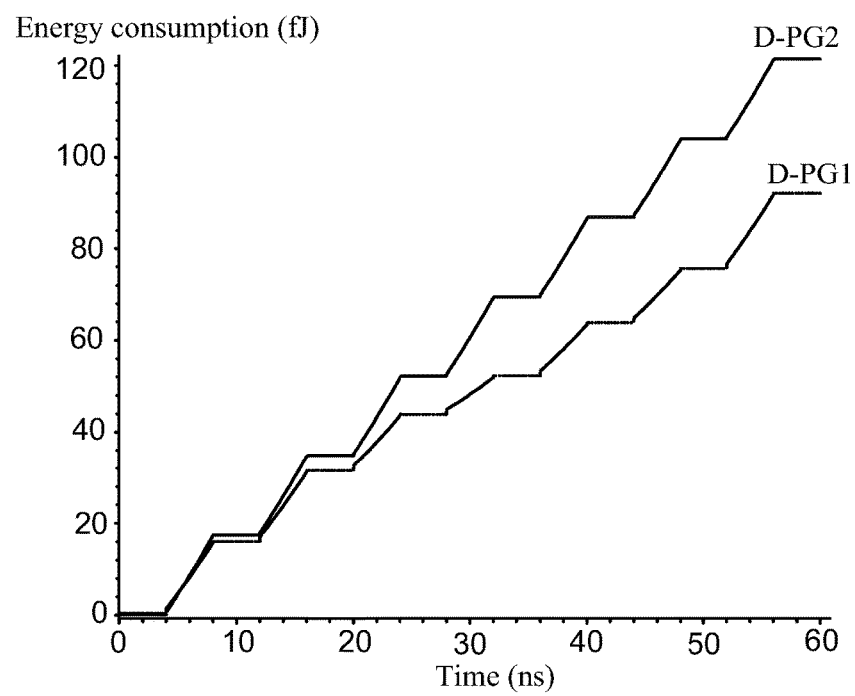
FIG. 6 is an energy consumption diagram of a CNFET-based double-edge-triggered pulse generator in Examples 1-2.

FIG. 5 is a transient waveform diagram of a CNFET-based double-edge-triggered pulse generator in an output transient in Examples 1-2, and FIG. 6 is an energy consumption diagram of a CNFET-based double-edge-triggered pulse generator in Examples 1-2. As shown in FIGS. 5-6, compared with the output signal out in the Example 1, the output signal out2 in the Example 2 has a flat waveform and is more accurate.

According to the transient waveform diagram in the FIG. 5, the CNFET-based double-edge-triggered pulse generator in Example 1 (D-PG1) and the CNFET-based double-edge-triggered pulse generator in Example 2 (D-PG2) have correct logic function.

The time delay, the power consumption, and the number of transistors of the first double-edge-triggered pulse generator (N-PG1) in the prior art, the second double-edge-triggered pulse generator (N-PG2) in the prior art, the CNFET-based double-edge-triggered pulse generator in Example 1 (D-PG1), and the CNFET-based double-edge-triggered pulse generator in Example 2 (D-PG2) are employed to perform a comparison in Table 1:

TABLE 1

| Name | Time delay of the rising edge/ps | Time delay of the falling edge D-Q/ps | Average power consumption/ uw | Number of transistors |
| --- | --- | --- | --- | --- |
| D-PG1 | 6.7 | 1.93 | 1.53 | 14 |
| D-PG2 | 7.5 | 5.54 | 2.03 | 18 |
| N-PG1 | 50.9 | 84.8 | 9.11 | 18 |
| N-PG2 | 60.8 | 70.9 | 8.90 | 14 |

According to the data in the Table 1 and the energy consumption diagram in the FIG. 6, the CNFET-based double-edge-triggered pulse generator in the invention consumes less power. According to the Table 1, compared with the N-PG1, the average power consumptions of the D-PG1 and the D-PG2 reduce by 83.21% and 77.72%, respectively. Compared with the N-PG2, the average power consumptions of the D-PG1 and the D-PG2 reduce by 82.81% and 77.19%, respectively. According to Table 1, the time delay of the D-PG1 and the D-PG2 whether at the rising edge or at the falling edge is shorter than that of the N-PG1 and the N-PG2, this is because the N-PG1 and the N-PG2 employ the TSMC 180 nm CMOS technology, and work at a working voltage of 1.8 V, while the D-PG1 and the D-PG2 in the invention employ the CNFET which features high speed and low power consumption, and work at a relatively low voltage.

Example 4

As shown in FIG. 4, a CNFET based pulse generator, comprising a first Carbon Nanotube Field Effect Transistor (CNFET) N1, a second CNFET N2, a third CNFET N3, a fourth CNFET N4, a fifth CNFET N5, a sixth CNFET N6, a seventh CNFET N7, an eighth CNFET N8, a ninth CNFET N9, a tenth CNFET N10, an eleventh CNFET N11, a twelfth CNFET N12, a thirteenth CNFET N13, and a fourteenth CNFET N14. The first CNFET N1, the third CNFET N3, the fifth CNFET N5, the seventh CNFET N7, the tenth CNFET N10, the twelfth CNFET N12, and the thirteenth CNFET N13 are P-type CNFET. The second CNFET N2, the fourth CNFET N4, the sixth CNFET N6, the eighth CNFET N8, the ninth CNFET N9, the eleventh CNFET N11, and the fourteenth CNFET N14 are N-type CNFET.

A gate of the first CNFET N1, a gate of the second CNFET N2, a source of the seventh CNFET N7, a gate of the eighth CNFET N8, and a gate of the thirteenth CNFET N13 are connected together, and a connection end thereof is a signal input end of the pulse generator. A source of the first CNFET N1, a substrate of the first CNFET N1, a source of the third CNFET N3, a substrate of the third CNFET N3, a source of the fifth CNFET N5, a substrate of the fifth CNFET N5, a substrate of the seventh CNFET N7, a source of the tenth CNFET N10, a substrate of the tenth CNFET N10, a source of the twelfth CNFET N12, a substrate of the twelfth CNFET N12, and a substrate of the thirteenth CNFET N13 are connected to a power supply. A drain of the first CNFET N1, a drain of the second CNFET N2, a gate of third CNFET N3, and a gate of the fourth CNFET N4 are connected together. A drain of the third CNFET N3, a drain of the fourth CNFET N4, a gate of the fifth CNFET N5, and a gate of the sixth CNFET N6 are connected together. A drain of the fifth CNFET N5, a drain of the sixth CNFET N6, a gate of the seventh CNFET N7, a gate of the ninth CNFET N9, a gate of the twelfth CNFET N12, and a gate of the fourteenth CNFET N14 are connected together. A drain of the seventh CNFET N7, a drain of the eighth CNFET N8, a gate of the tenth CNFET N10, and a gate of the eleventh CNFET N11 are connected together. A source of the eighth CNFET N8 and a drain of the ninth CNFET N9 are connected. A drain of the twelfth CNFET N12 and a drain of the thirteenth CNFET N13 are connected together. A drain of the tenth CNFET N10, a drain of the eleventh CNFET N11, a source of the thirteenth CNFET N13, and a drain of the fourteenth N14 are connected together, and a connection end thereof is a signal output end of the pulse generator. A substrate of the second CNFET N2, a source of the second CNFET N2, a substrate of the fourth CNFET N4, a source of the fourth CNFET N4, a substrate of the sixth CNFET N6, a source of the sixth CNFET N6, a substrate of the eighth CNFET N8, a substrate of the ninth CNFET N9, a source of the ninth CNFET N9, a substrate of the eleventh CNFET N11, a source of the eleventh CNFET N11, a substrate of the fourteenth CNFET N14, and a source of the fourteenth CNFET N14 are grounded.

In the example, the pulse generator further comprises a signal conditioning circuit. The signal conditioning circuit comprises a fifteenth CNFET N15, a sixteenth CNFET N16, a seventeenth CNFET N17, and an eighteenth CNFET N18. The fifteenth CNFET N15 and the seventeenth CNFET N17 are P-type CNFET. The sixteenth CNFET N16 and the eighteenth CNFET N18 are N-type CNFET. A gate of the fifteenth CNFET N15 and a gate of the sixteenth CNFET N16 are connected to the signal output end of the pulse generator. A drain of the fifteenth CNFET N15, a drain of the sixteenth CNFET N16, a gate of the seventeenth CNFET N17, and a gate of the eighteenth CNFET N18 are connected together. A source of the fifteenth CNFET N15, a substrate of the fifteenth CNFET N15, a source of the seventeenth CNFET N17, and a substrate of the seventeenth CNFET N17 are connected to the power supply. A source of the sixteenth CNFET N16, a substrate of the sixteenth CNFET N16, a source of the eighteenth CNFET N18, and a substrate of eighteenth CNFET N18 are grounded. A drain of the seventeenth CNFET N17 is connected to a drain of the eighteenth CNFET N18, and a connection end thereof is an output end of the signal conditioning circuit.

In the example, the first CNFET N1, the second CNFET N2, the third CNFET N3, the fourth CNFET N4, the fifth CNFET N5, the sixth CNFET N6, the tenth CNFET N10, and the eleventh CNFET N11 are CNFETs having a diameter of 0.398 nm. The seventh CNFET N7, the eighth CNFET N8, the ninth CNFET N9, the twelfth CNFET N12, the thirteenth CNFET N13, the fourteenth CNFET N14, the fifteenth CNFET N15, the sixteenth CNFET N16, the seventeenth CNFET N17, and the eighteenth CNFET N18 are CNFETs having a diameter of 0.293 nm.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A Carbon Nanotube Field Effect Transistor (CNFET) based pulse generator, comprising:
    a first CNFET;
    a second CNFET;
    a third CNFET;
    a fourth CNFET;
    a fifth CNFET;
    a sixth CNFET;
    a seventh CNFET;
    an eighth CNFET;
    a ninth CNFET;
    a tenth CNFET;
    an eleventh CNFET;
    a twelfth CNFET;
    a thirteenth CNFET; and
    a fourteenth CNFET;
    wherein
        the first CNFET, the third CNFET, the fifth CNFET, the seventh CNFET, the tenth CNFET, the twelfth CNFET, and the thirteenth CNFET are P-type CNFETs;
        the second CNFET, the fourth CNFET, the sixth CNFET, the eighth CNFET, the ninth CNFET, the eleventh CNFET, and the fourteenth CNFET are N-type CNFETs;
        a gate of the first CNFET, a gate of the second CNFET, a source of the seventh CNFET, a gate of the eighth CNFET, and a gate of the thirteenth CNFET are connected together, and a connection end thereof is a signal input end of the pulse generator;
        a source of the first CNFET, a substrate of the first CNFET, a source of the third CNFET, a substrate of the third CNFET, a source of the fifth CNFET, a substrate of the fifth CNFET, a substrate of the seventh CNFET, a source of the tenth CNFET, a substrate of the tenth CNFET, a source of the twelfth CNFET, a substrate of the twelfth CNFET, and a substrate of the thirteenth CNFET are connected to a power supply;
        a drain of the first CNFET, a drain of the second CNFET, a gate of third CNFET, and a gate of the fourth CNFET are connected together;
        a drain of the third CNFET, a drain of the fourth CNFET, a gate of the fifth CNFET, and a gate of the sixth CNFET are connected together;
        a drain of the fifth CNFET, a drain of the sixth CNFET, a gate of the seventh CNFET, a gate of the ninth CNFET, a gate of the twelfth CNFET, and a gate of the fourteenth CNFET are connected together;
        a drain of the seventh CNFET, a drain of the eighth CNFET, a gate of the tenth CNFET, and a gate of the eleventh CNFET are connected together;
        a source of the eighth CNFET, a drain of the ninth CNFET, a drain of the twelfth CNFET, and a drain of the thirteenth CNFET are connected together;
        a drain of the tenth CNFET, a drain of the eleventh CNFET, a source of the thirteenth CNFET, and a drain of the fourteenth are connected together, and a connection end thereof is a signal output end of the pulse generator; and
        a substrate of the second CNFET, a source of the second CNFET, a substrate of the fourth CNFET, a source of the fourth CNFET, a substrate of the sixth CNFET, a source of the sixth CNFET, a substrate of the eighth CNFET, a substrate of the ninth CNFET, a source of the ninth CNFET, a substrate of the eleventh CNFET, a source of the eleventh CNFET, a substrate of the fourteenth CNFET, and a source of the fourteenth CNFET are grounded.

2. The pulse generator in claim 1, wherein the first CNFET, the second CNFET, the third CNFET, the fourth CNFET, the fifth CNFET, the sixth CNFET, the tenth CNFET, and the eleventh CNFET are CNFETs having a diameter of 0.398 nm; and the seventh CNFET, the eighth CNFET, the ninth CNFET, the twelfth CNFET, the thirteenth CNFET, and the fourteenth CNFET are CNFETs having a diameter of 0.293 nm.

3. The pulse generator of claim 1, wherein
    the pulse generator further comprises a signal conditioning circuit;
    the signal conditioning circuit comprises a fifteenth CNFET, a sixteenth CNFET, a seventeenth CNFET, and an eighteenth CNFET;
    the fifteenth CNFET and the seventeenth CNFET are P-type CNFETs;
    the sixteenth CNFET and the eighteenth CNFET are N-type CNFETs;
    a gate of the fifteenth CNFET and a gate of the sixteenth CNFET are connected to the signal output end of the pulse generator;
    a drain of the fifteenth CNFET, a drain of the sixteenth CNFET, a gate of the seventeenth CNFET, and a gate of the eighteenth CNFET are connected together;
    a source of the fifteenth CNFET, a substrate of the fifteenth CNFET, a source of the seventeenth CNFET, and a substrate of the seventeenth CNFET are connected to the power supply;
    a source of the sixteenth CNFET, a substrate of the sixteenth CNFET, a source of the eighteenth CNFET, and a substrate of eighteenth CNFET are grounded; and
    a drain of the seventeenth CNFET is connected to a drain of the eighteenth CNFET, and a connection end thereof is an output end of the signal conditioning circuit.

4. The pulse generator of claim 3, wherein
    the first CNFET, the second CNFET, the third CNFET, the fourth CNFET, the fifth CNFET, the sixth CNFET, the tenth CNFET, and the eleventh CNFET are CNFETs having a diameter of 0.398 nm; and
    the seventh CNFET, the eighth CNFET, the ninth CNFET, the twelfth CNFET, the thirteenth CNFET, the fourteenth CNFET, the fifteenth CNFET, the sixteenth CNFET, the seventeenth CNFET, and the eighteenth CNFET are CNFETs having a diameter of 0.293 nm.

* * * * *